United States Patent [19]
Kokaku et al.

[11] Patent Number: 5,651,867
[45] Date of Patent: Jul. 29, 1997

[54] PLASMA PROCESSING METHOD AND APPARATUS

[75] Inventors: Yuichi Kokaku, Yokohama, Japan; Hiroyuki Kataoka, Pallo Alto, Calif.; Makoto Kitoh, Yokohama, Japan; Shigehiko Fujimaki, Machida, Japan; Satoshi Matsunuma; Kenji Furusawa, both of Yokohama, Japan; Nobuo Nakagawa, Yokohama, Japan; Katsuo Abe, Yokosuka, Japan; Masaaki Hayashi, Odawara, Japan

[73] Assignee: Hitachi, Ltd., Tokyo, Japan

[21] Appl. No.: 591,935

[22] Filed: Oct. 2, 1990

[30] Foreign Application Priority Data

Oct. 2, 1989 [JP] Japan .................... 1-257290

[51] Int. Cl.$^6$ ................................ C23C 14/34
[52] U.S. Cl. .................. 204/298.25; 204/298.06; 204/298.07; 204/298.11; 204/298.15; 118/723 R; 118/719; 118/723 E
[58] Field of Search ............... 118/719, 720, 118/722, 723, 50.1, 723 R, 723 E; 204/192.12, 192.15, 192.16, 192.22, 192.2, 192.32, 298.06, 298.08, 298.07, 298.23, 298.11, 298.25, 298.15, 298.26; 156/345

[56] References Cited

U.S. PATENT DOCUMENTS

| | | | |
|---|---|---|---|
| 4,500,407 | 2/1985 | Boys et al. | 204/298.25 |
| 4,601,807 | 7/1986 | Lo et al. | 204/192.12 X |
| 4,632,719 | 12/1986 | Chow et al. | 204/298.33 X |
| 4,693,777 | 9/1987 | Hazano et al. | 204/298.25 X |
| 4,714,536 | 12/1987 | Freeman et al. | 204/192.2 X |
| 4,749,465 | 6/1988 | Flint et al. | 204/192.12 X |
| 4,767,641 | 8/1988 | Kieser et al. | 118/729 X |
| 4,778,582 | 10/1988 | Howard | 204/192.2 X |
| 4,830,891 | 5/1989 | Nishitani et al. | 427/253 |
| 4,894,133 | 1/1990 | Hedgesth | 204/298.25 X |
| 4,897,172 | 1/1990 | Katsura et al. | 204/298.11 X |
| 4,927,513 | 5/1990 | Schultheiss et al. | 204/298.23 X |

*Primary Examiner*—Nam Nguyen
*Attorney, Agent, or Firm*—Antonelli, Terry, Stout & Kraus, LLP

[57] ABSTRACT

A plasma processing apparatus comprising: a vacuum container; an evacuation means for keeping the interior of the vacuum container at a pressure not higher than atmospheric pressure; a substrate support device for supporting a substrate to be subjected to plasma processing; an electrode for generating plasma in cooperation with the substrate support; a voltage supply for applying a voltage to the electrode; a gas introducing system for introducing a gaseous material into a space where the plasma is produced; a surrounding member for enclosing the space above the substrate support, and a drive for relatively moving the surrounding member to space an end of the surrounding member proximate from the substrate from at least one of the substrate support and the substrate supported thereon by a distance which is short enough to suppress plasma leakage during the plasma processing and to position the end of the surrounding member away from said at least one of the substrate support and the substrate thereon for charging and discharging of the substrate.

23 Claims, 6 Drawing Sheets

F I G. 4A
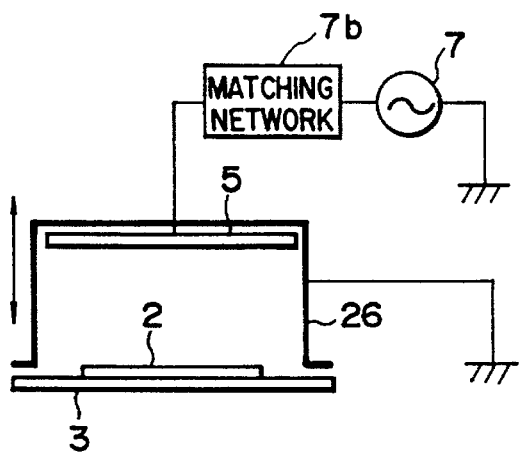
F I G. 4B
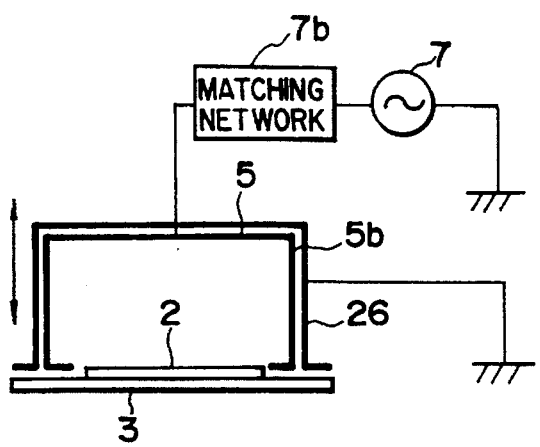
F I G. 4C
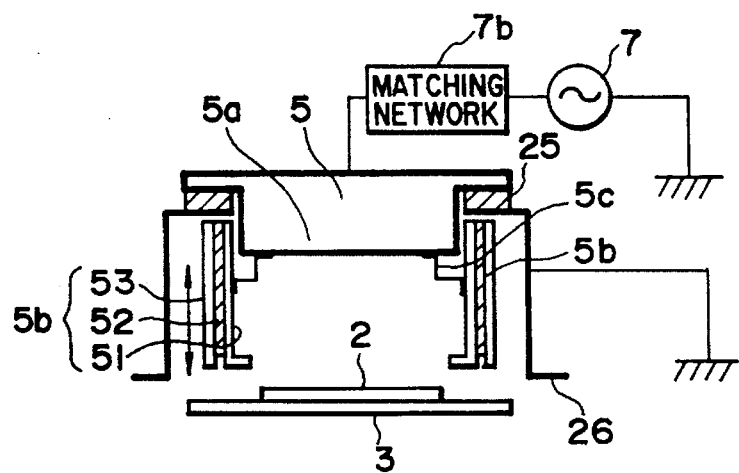

5,651,867

PLASMA PROCESSING METHOD AND APPARATUS

BACKGROUND OF THE INVENTION

1. Field of the Invention

The present invention relates to a plasma processing method and apparatus, and more particularly to an apparatus and method suitable for a continuous plasma processing system in which a substrate to be processed is intermittently and successively fed and subjected to plasma-processing when the substrate is in a stationary position.

2. Description of Prior Art

A plasma processing apparatus is widely used in the industry, in which materials are continuously processed in a plasma atmosphere by feeding the materials to be processed with holders for holding the materials thereon to a reactor, effecting desired modification or etching on the materials in the plasma atmosphere and taking out the processed materials. As examples of the plasma processing apparatuses, there may be mentioned a plasma etching apparatus of a sheet-feed type used in a preprecessing far semiconductor production, a sputter deposition apparatus for forming multilayer films on a magnetic disk or an optical disk as disclosed in National Publication of Translated Version No. 62-502846 (PCT), etc.

Also well known is an etching method or an ion-assist film forming method by a high-energy ion utilizing a self-bias effect obtained in a high-frequency plasma environment by a difference in areas of electrodes, such as a reactive ion etching method, a high-hard carbon film forming method, etc. Although the processing is generally effected on the side of an electrode to which a high-frequency voltage is applied, the processing may also be effected on the side of a grounded substrate by increasing the area of the hot electrode to which the high-frequency voltage is applied, as disclosed in Japanese Patent Application Publication (KOKAI) No. 62-274080. The Application discloses a high-frequency electrode configured to surround plasma generated. The high-frequency electrode has, at a side thereof, an opening. A grounded substrate to be processed with a holder for holding the same is placed so as to cover the opening. Plasma is generated between the electrode and the substrate or the holder. With this arrangement, the area of a portion of the high-frequency electrode where it contacts the plasma generated can be much larger than that of a portion of the grounded side which contact the plasma. Thus, the film forming or etching can be effected on the grounded substrate by utilizing the self-bias effect. This is especially advantageous where a number of substrates are to be continuously processed, because the processing can be made on the substrate at the ground potential.

Conventional plasma processing apparatuses of a continuous processing type have such a disadvantage that when a drive mechanism or a substrate holder located around the substrate being processed is subject to film forming or heating when the plasma generated leaks. Particularly in a film forming process such as plasma CVD, films are liable to accumulate on the undesired parts. The so accumulated films will finally come off and result in foreign matters which will possibly adhere to the substrate.

When it is required to carry out another process such as heating, cooling, deposition, sputtering, CDV or the like in an area adjoining the plasma processing area, leakage of plasma causes various undesirable effects such as pollution of a heater in the processing area, causing trouble of the heater, or contamination of the film formed with foreign matters.

Another serious problem in the plasma processing method where self-bias effect is applied is that if the plasma spreads out of the processing area, a potential of the plasma becomes closer to the ground potential because it is difficult to obtain a high ratio of the area of the high-frequency electrode contacting the plasma to the area of the other part. This prevents desired processing on the substrate.

The cause of the problem lines in that the generated plasma leaks and expands if a clearance between the electrode and the substrate is large. The leakage of the plasma cannot be prevented by directly connecting the electrode to the substrate, because a difference in potential between the electrode and the substrate is as large as 100 V to 2,000 or 3,000 V. On the other hand, the clearance must be large enough to pass the substrate with the holder therethrough to transport the substrate into or from the area before and after the processing.

It is well known that the leakage of plasma can be prevented by decreasing the clearance between the electrode of a high voltage and the part of a ground potential. A gas pressure in the processing area is, however, from 0.01 to 9.5 Torr when conducting a plasma processing. To prevent the leakage of plasma at the pressure, the clearance must be from 1 to 3 mm. it is, however, difficult to pass the substrate through that narrow clearance, it is more difficult or impossible when the substrates have raised portions or have dimensional errors.

SUMMARY OF THE INVENTION

It is an object of the present invention to provide a plasma processing method where leakage of plasma from an area surrounded by an electrode and a substrate to be processed is prevented.

It is another object of the present invention to provide a plasma processing apparatus which is capable of preventing leakage of plasma from an area surrounded by an electrode and a substrate to be processed.

According to one aspect of the present invention, there is provided a plasma processing apparatus comprising: a vacuum container; an evacuation means for keeping the interior of the vacuum container at a pressure not higher than atmospheric pressure; a substrate support means for supporting a substrate to be subjected to plasma processing; an electrode for generating plasma in cooperation with the substrate support means; a voltage supply means for applying a voltage to the electrode; a gas introducing means for introducing a gaseous material into a space where the plasma is produced; a surrounding member for enclosing the space above the substrate support means, and a drive means for relatively moving the surrounding member to locate an extremity of the surrounding member to space from at least one of the substrate or the substrate holder by a clearance which is short enough to suppress plasma leakage during the plasma processing, and to position the extremity of the surrounding member away from said at least one of the substrate support means and the substrate thereon for charging and discharging of the substrate.

According to another aspect of the present invention, there is provided a plasma processing apparatus wherein two sets of said evacuation means, electrode, voltage supply means, gas introduction means, surrounding member and drive means are provided; each set being disposed on opposite sides of the substrate support means for carrying out the plasma processing on opposite surfaces of the substrate; said substrate support means including a substrate holding means for holding the substrate so that the opposite surfaces of the substrate are subjected to the plasma processing.

When it is desired to utilize a self-bias effect, a ratio in an area of a portion of the electrode which contacts plasma generated to that of a portion of the substrate to be processed which contacts the plasma is selected to be 1.5 or more.

A means for evacuation and/or gas feeding may preferably be provided on the electrode.

The leakage of plasma from the space enclosed by the electrode and the substrate may be achieved by varying a clearance between a main body of the electrode and the surface of the substrate or the substrate holder in synchronization with conveyance of the substrate and keeping the clearance sufficiently narrow to trap the plasma in the space during generation of the plasma. The clearance is preferably not larger than 5 mm, and more preferably not larger than 2 mm.

When the substrate is introduced, the electrode is kept away from the processing section. After the substrate is set in the processing section, the electrode is relatively brought near the substrate up to a position where plasma does not leak. The electrode is then applied with a high voltage from a power source to generate plasma. After processing, the production of the plasma is stopped and the electrode is relatively retracted from the substrate. The substrate is thereafter sent out.

If both surfaces of a substrate are desired to be processed in the plasma environment simultaneously, the substrate is introduced between the electrodes disposed facing to each other, then the electrode are brought near to the substrate up to a position where plasma does not leak, to conduct a desired processing by plasma. After processing, the generation of plasma is stopped, the electrodes are retracted, and the substrate is carried out.

Consequently, deposition of film occurs only on the substrates to be processed and the inner surface of the electrode. This facilitates cleaning. An undesired effect to the adjoining processing area can be suppressed.

In addition, according to the present invention, may be solved a serious problem due to leakage of plasma, which would, otherwise, cause the ratio in area of the two electrodes to be reversed, preventing a desired effect where a high bias-voltage generated on the side of the substrate is used, by enlarging the area of the electrode to which a high-frequency voltage is applied.

It is generally possible to trap plasma without moving the electrode itself so long as the electrode is placed to have a minimum clearance for allowing the substrate or the holder to be fed-in and out therethrough. In fact, however, it is extremely difficult to keep the clearance between the substrate and the electrode appropriately. The substrate does not always have a flat configuration, accuracy of positioning might be insufficient, or the substrate itself may have an irregular shape. Particularly, the difficulty is increased when the processing is to be conducted on both surfaces of the substrate. According to the present invention, trapping of plasma is possible even in such cases.

An advantage of the present invention is that the generated plasma is enclosed only within a desired area, so that undesired film formation on the unintended part or heating of the undesired part by plasma may be prevented. This is also advantageous from the view of maintenance of the apparatus.

Accordingly, the present invention can provide a method and an apparatus efficient in plasma processing in which a number of substrates are successively supplied. Thus, this invention can suitably be applied to a multi-step continuous processing apparatus.

BRIEF DESCRIPTION OF THE DRAWINGS

Other objects and advantages of the invention will be apparent from the following description, the appending claims and the accompanying drawings, in which:

FIGS. 4A, 4B and 4C are schematic vertical sectional views showing various forms of electrodes employable in the present invention;

DETAILED DESCRIPTION OF THE PREFERRED EMBODIMENTS

Figure 1:
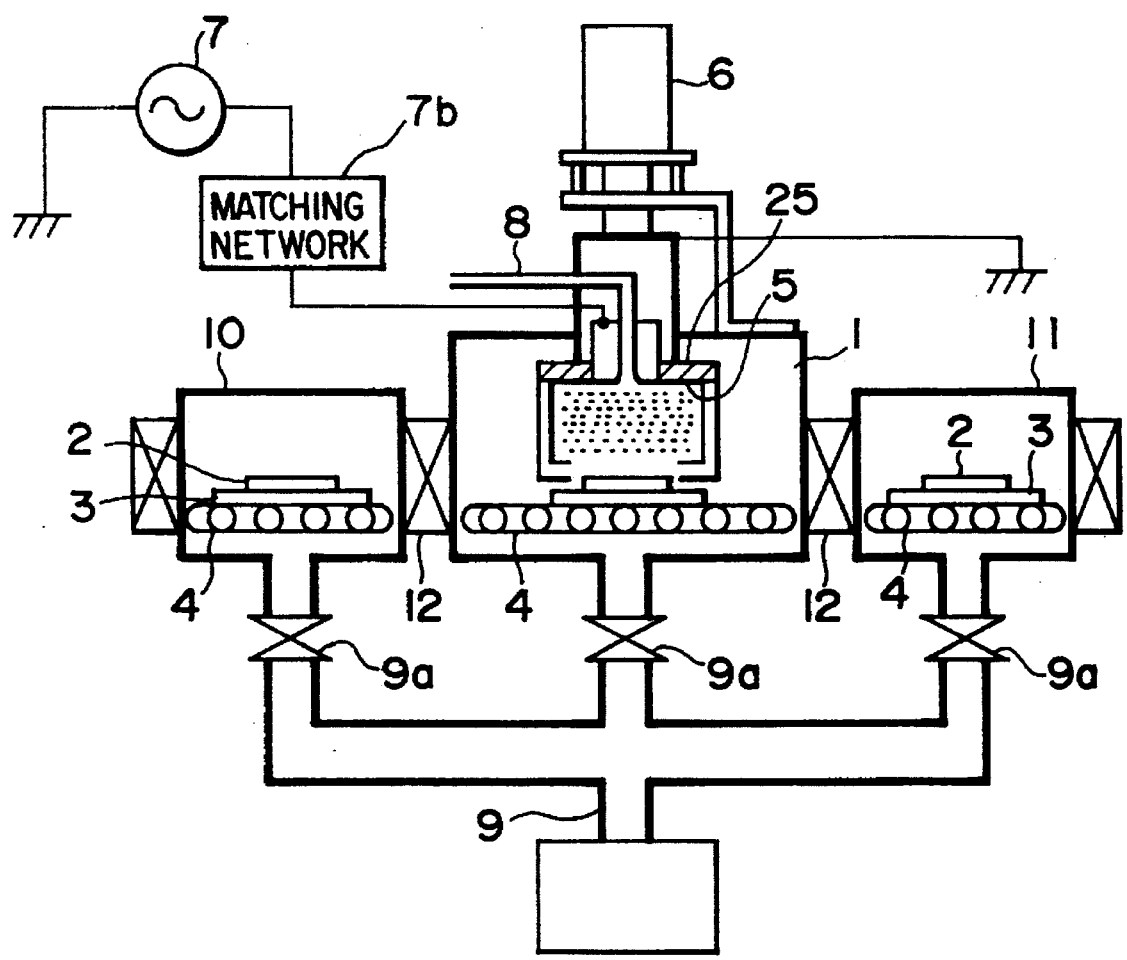
FIG. 1 is a schematic vertical sectional view showing a basic structure of a plasma processing apparatus of a first embodiment according to this invention.

FIG. 1 shows a first form of a plasma processing apparatus embodying the present invention.

The plasma processing apparatus shown in FIG. 1 comprises a vacuum chamber 1 which is adapted to be kept at a pressure not higher than atmospheric pressure, a holder 3 carrying a substrate 2 to be processed thereon, conveyer means 4 for conveying or transporting the substrate 2 on the holder 3 into or from the the vacuum chamber 1, a hot electrode 5 to which a high voltage is applied to generate plasma between the hot electrode 5 and an oppositely placed cold electrode (the holder 3 in this embodiment), a drive 6 for moving the electrode 5 towards the substrate 2 to position the electrode 5 near the substrate 2 or retracting the electrode 5 away from the substrate 2, a voltage applying means including a power source 7 and a matching network 7b which applies a high voltage to the electrode 5, a gas introducing system 8 which introduces a gaseous material into a plasma generating area between the electrodes, an evacuation system 9 for keeping the interior Of the vacuum chamber 1 at a pressure not higher than atmospheric pressure, and valves 9a for operatively separating the vacuum chamber i from the evacuation system 9.

The plasma processing apparatus further comprises a charging chamber 10 for charging the substrate 1 into a processing system, a drawing out or discharging chamber 11 for drawing out or discharging the substrate 1 from the processing system and valves 12 which separate the vacuum chamber 1 from the charging chamber 10 and the discharging chamber 11, respectively.

The conveyor means 4 for conveying the holder 3 with the substrate 2 mounted thereon are provided in these chambers 10, 1 and 11. The conveyor means has a function to support the substrate 2 in cooperation with the substrate 2, and an interlock means for an interlock operation with the drive 6 so as to allow the substrate 2 to be fed or discharged only/when the electrode 5 is away from the substrate 2. Gas in the charging chamber 10 and the discharging chamber 11 is evacuated through the respective valves 9a by the evacuation system 9. The charging chamber 10 and the discharging chamber 11 are not essential and may be omitted as the case may be.

The electrode employable in this embodiment is constructed, for example, as shown in FIG. 4A, FIG. 4B or FIG. 4C.

In FIG. 4A, a grounded cover 26 is configured to surround the hot electrode 5 and cooperates with the holder 3 to enclose the plasma generating area. The grounded cover 26 is adapted to move in a direction perpendicular with respect to the holder 3 so as to trap plasma therein during the plasma processing, while allowing the substrate 2 on the holder 3 to enter or leave the plasma generating area before or after the processing. This form of electrode may be used for a sputter deposition, a plasma CVD, etc.

In FIG. 4B, the hot electrode 5 to which a high voltage is applied has an extension 5a which surrounds a space defined in cooperation with the substrate 2 or the holder 3. A grounded cover 26 is provided to prevent generation of plasma outside the electrode 5. The electrode 5 and the grounded cover 26 are moved together. When high-frequency plasma is generated by the electrode, a large voltage drop is caused in the vicinity of the substrate 2, which is suitable for reactive ion etching or formation of a hard carbon film.

Figure 6:
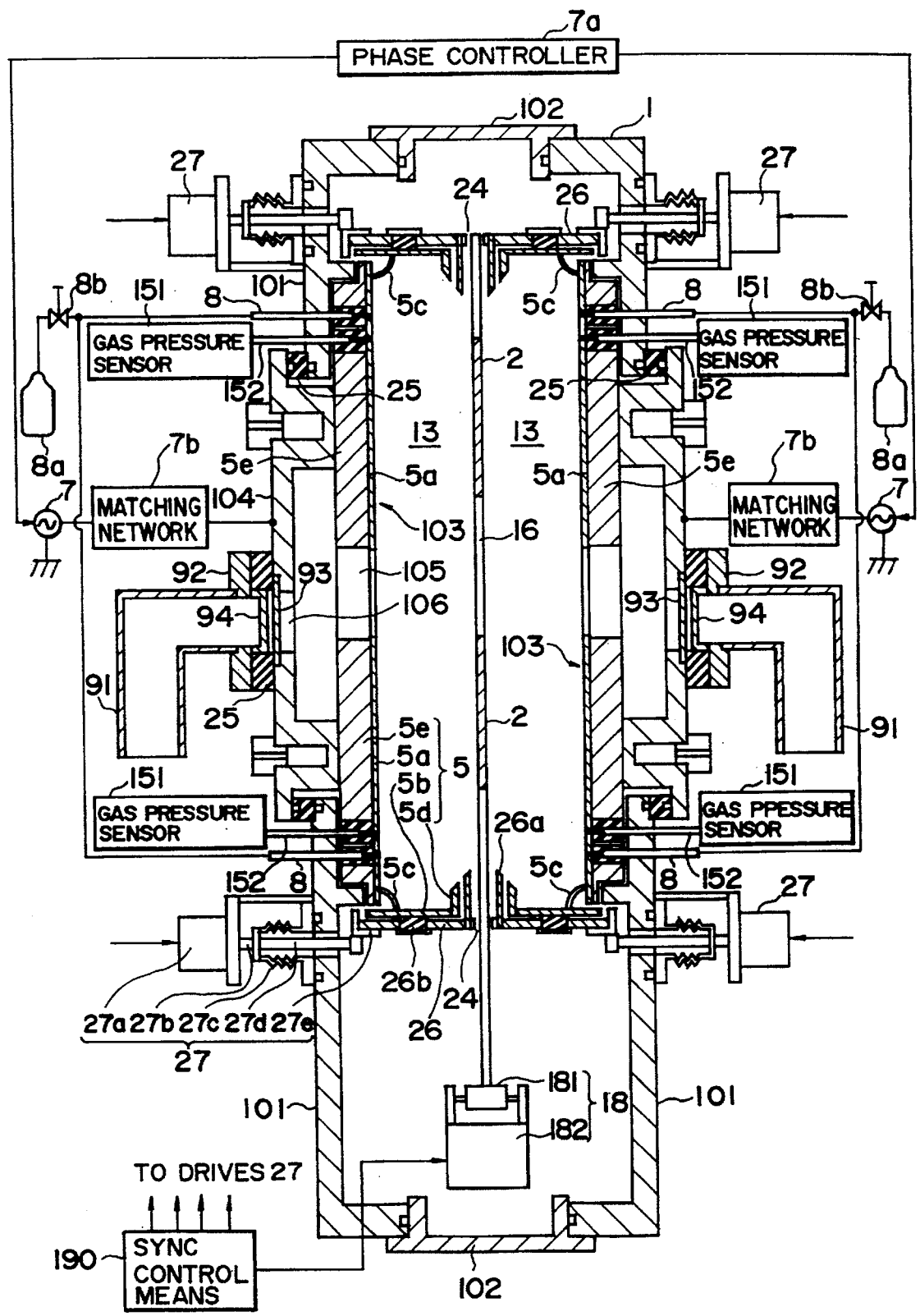
FIG. 6 is a schematic vertical sectional view of a plasma CVD chamber of the system shown in FIG. 5, viewed from the side of a discharging chamber.

FIG. 4C illustrates a further form of electrode employable in the present embodiment. The electrode 5 comprises a front portion 5a located opposite to the substrate 2 fed for the plasma processing and side portions 5b, the front portion 5a and the side portions 5b being separately formed and being electrically connected by connectors 5c. Each of the side portions 5b is formed in a three-layer construction of a conductor 51, an insulator 52 and a conductor 53. The conductor 51 is electrically connected to the front portion 5a to function as an electrode. In the arrangement of FIG. 4C, the front portion 5a of the electrode 5 is fixed and the side portions 5b thereof are moved in a direction indicated by an arrow in FIG. 4C. This provides substantially the same effects of the arrangement of FIG. 4B. This structure of the electrode, however, can reduce the burden of the drive 6 as compared with the arrangement in which the entire electrode is moved. The arrangement as illustrated in FIG. 4C, since the front portion 5a of the electrode 5 is fixed as described above, is especially advantageous for double-face processing in which a plasma processing is carried out simultaneously on both surfaces of the substrate 2. The double-face processing is carried out, for example, by an arrangement as illustrated in FIG. 6 as will be described later.

The effects of the plasma processing apparatus according to the embodiment will be further enhanced by:

1) forming an inlet in the electrode for introducing the gas for the plasma processing to provide a uniform distribution of the gas in the processing area;
2) forming an outlet in the electrode for evacuating the gas filled in the processing area directly through the outlet to improve an evacuation efficiency; and
3) providing a pressure sensor directly on the electrode for accurate measure of a gas pressure in the processing area.

To achieve a simultaneous uniform plasma processing on both surfaces of the substrate, a gas pressure or flow rate, a voltage to be applied, or an electric current to be supplied may be controlled for the respective processing areas, independently of each other. By this control, a difference in performances of the processing (a film forming rate, a film quality, an etching rate, etc.) in the respective processing areas may be minimized. The phases of the voltage supplied to the hot electrodes may be controlled to further improve the uniformity of the processing.

When it is required to process only a single surface of the substrate as shown in FIG. 1, the electrode may be fixed and the conveyor means 4 may be movable to advance or retract with respect to the substrate to prevent plasma from leaking out of the processing area, while allowing the transportation of the substrate before and after the processing.

FIG. 2 illustrates steps of a plasma processing through carrying-in or charging, processing and carrying-out or discharging of the substrate, using the plasma processing apparatus shown in FIG. 1.

Figure 2A:
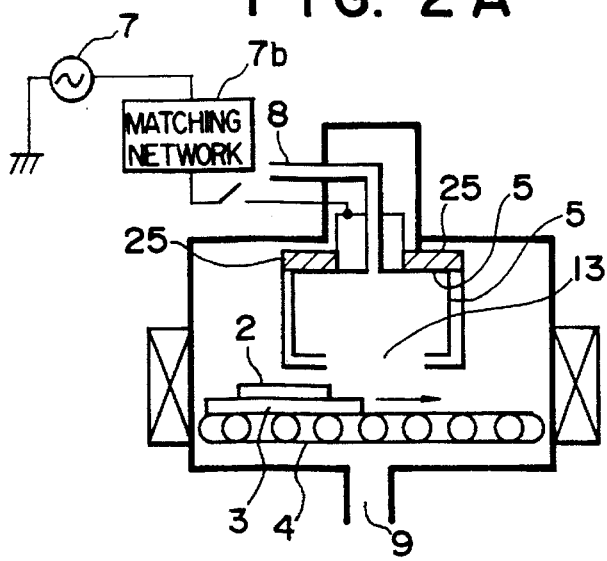
FIGS. 2A, 2B and 2C are vertical sectional views of a processing section of the plasma processing apparatus shown in FIG. 1, illustrating steps of a plasma processing performed on a substrate by using the plasma processing apparatus.
Figure 2B:
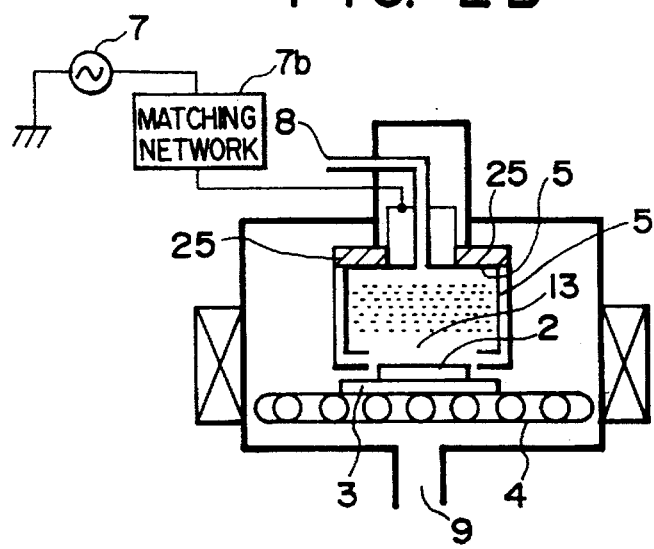
Figure 2C:
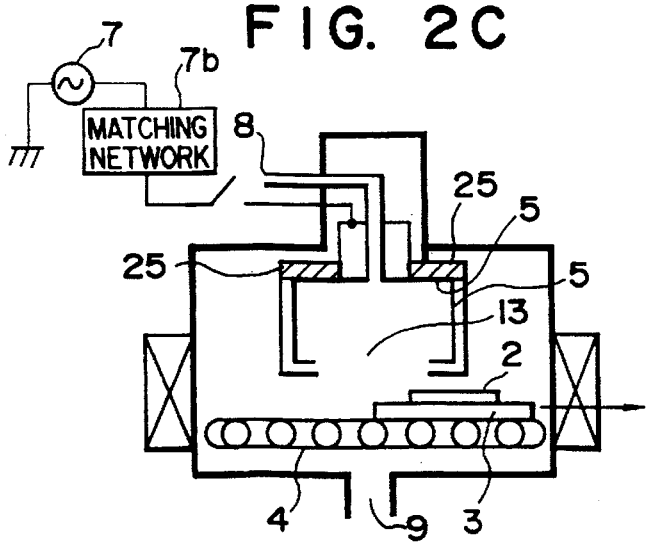

The hot electrode 5 is kept away from the processing area 13 for introduction of the substrate 2 as illustrated in FIG. 2A. The electrode 5 is then lowered until it is brought a position near the substrate 2 where plasma is not substantially leaked. The hot electrode 5 is applied with a high voltage from the power source 7 through the matching network 7b to generate plasma between the electrode 5 and the holder which functions as another, cold electrode as illustrated in FIG. 2B. After completion of the processing, the electrode 5 is retracted and the substrate is carried out as shown in FIG. 2C.

Figure 3:
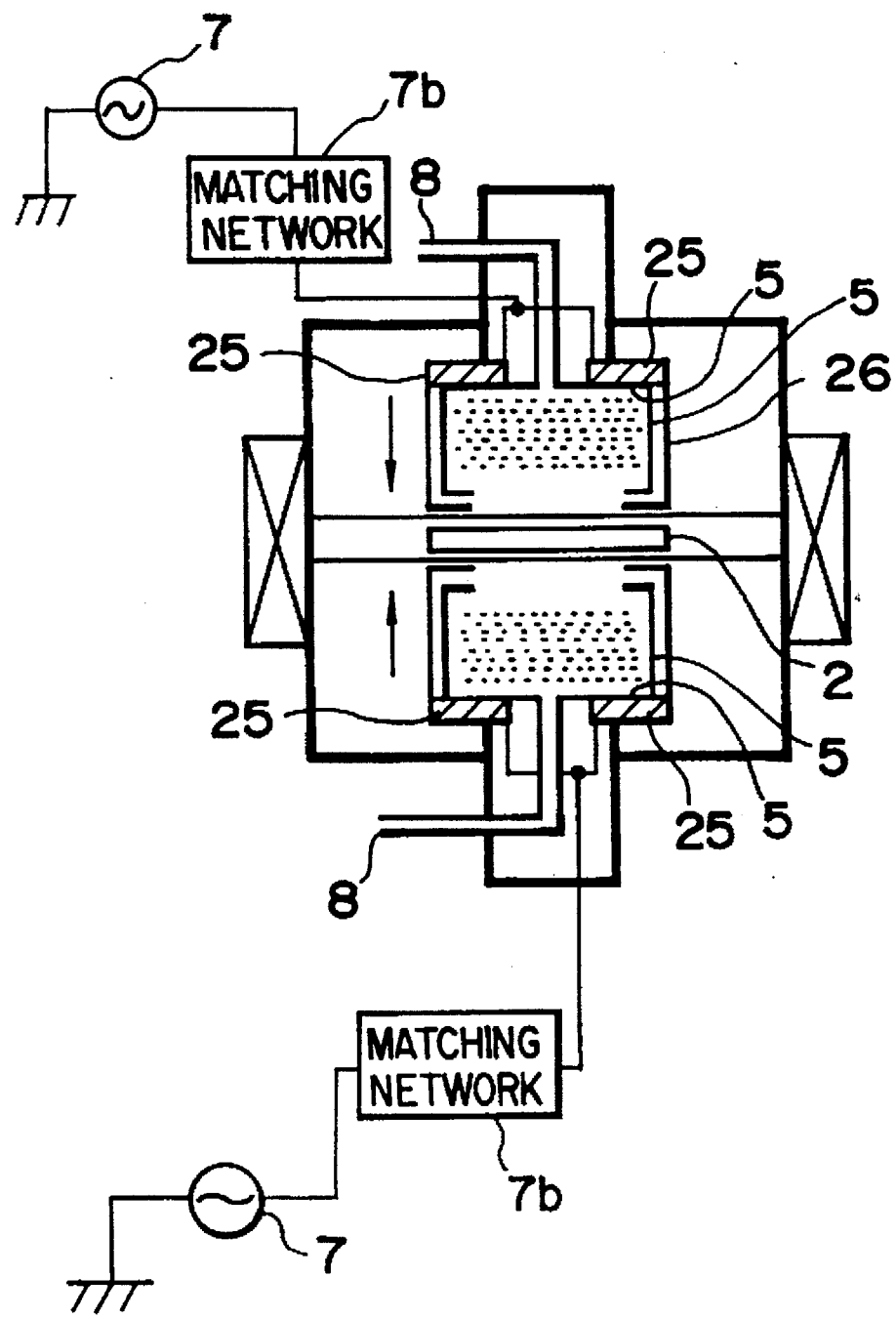
FIG. 3 is a vertical sectional view of a processing section of another form of a plasma processing apparatus suited for a double-surface processing according to the present invention.

FIG. 3 depicts a schematic vertical sectional view of a plasma processing apparatus for simultaneously processing opposite surfaces of the substrate. The substrate 2 is introduced between the electrodes 5 disposed facing to each other. The two electrodes 5 are, then, moved to near the substrate 2 to positions, where the electrodes 5 may enclose a space for plasma generation in cooperation with the substrate fed in position, for preventing plasma from leaking. Thereafter, plasma is generated by applying a high-frequency voltage to the electrodes 5 from the power source 7 through the matching network 7b to conduct a desired processing.

Figure 5:
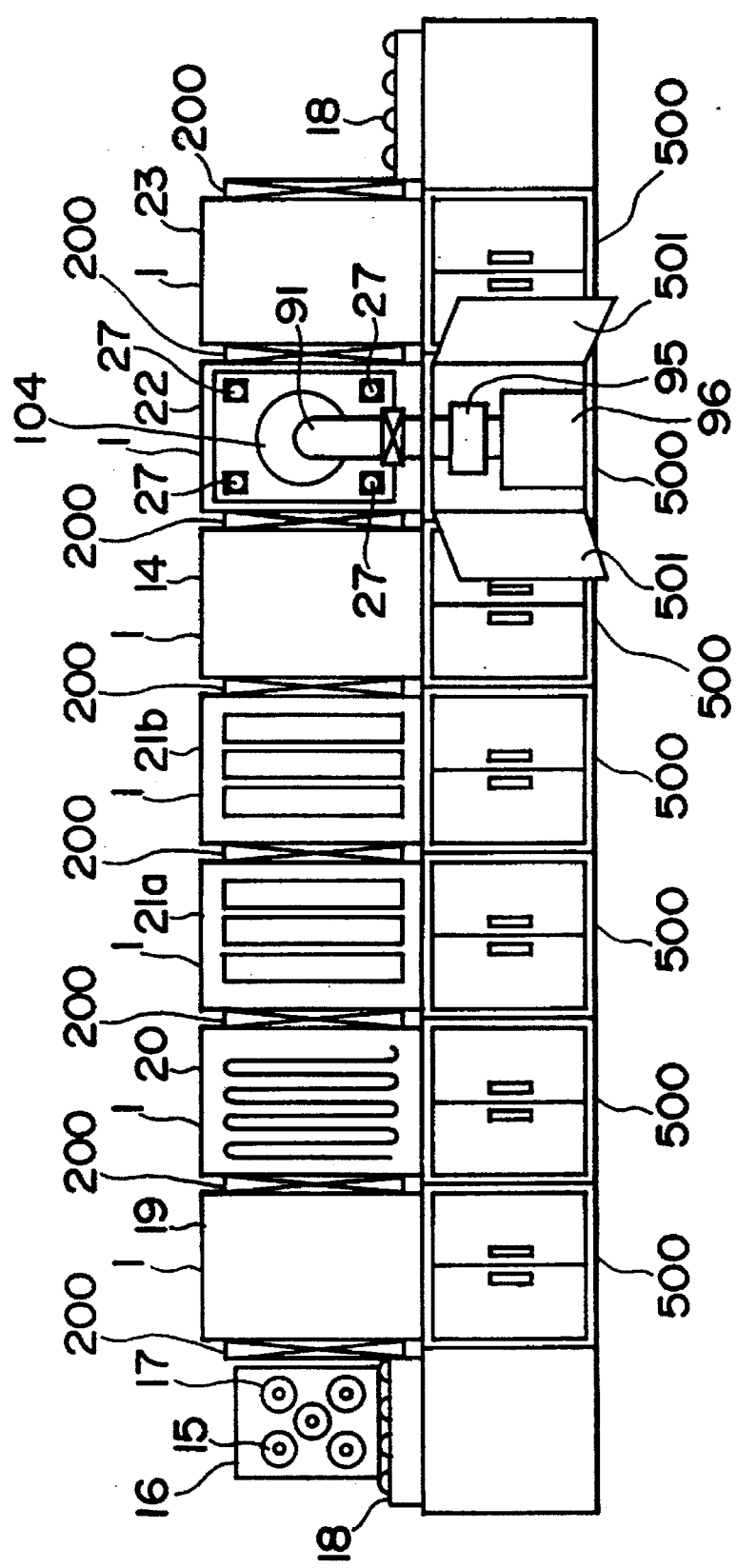
FIG. 5 is a front view showing a system for manufacturing a magnetic disk, in which a plasma processing apparatus according to the present invention is incorporated.

The present invention may suitably be applied to an in-line processing system in which a plurality of vacuum containers are connected in series. FIG. 5 shows one form of the in-line processing system.

The processing system is formed of seven vacuum containers 1 connected in series. The system is used for magnetic disk manufacturing. One of the vacuum containers 1 is used for the plasma processing apparatus as described above. The system comprises a charging or carrying-in chamber 19 for charging objects to be processed, a preliminary treatment chamber 20 for subjecting the objects to a preliminary treatment such as a preheating, sputter chambers 21a, 21b for depositing a film on the objects, a separation chamber 14 disposed between the sputter chamber 21b and another vacuum container 22 for separating the containers each other to prevent the gases of the containers from contaminating each other, the container 22 used for the desired plasma processing, i.e., a chemical vapor deposition (CVD), and a discharging or carrying-out chamber 23 for drawing the objects processed out of the processing system. The chambers are arranged in that order.

The chambers 19 to 23 each have air-tight sealing means 200 at a respect entrance and exit. The sealing means 200 may be used in common by the adjacent chambers. Through the sealing means 200, the chambers sealed from each other, while allowing any adjacent two chambers to communicate with each other when necessary. The charging chamber 19, and the discharging chamber 23 are adapted to communicate with the outside when required.

Each of the containers or chambers is placed on a base 500 and connected to an evacuation system contained in the base. The evacuation system comprises a valve 95 and a vacuum pump 96 shown in FIG. 5 with doors 501 open. The evacuation system is communicated with the respective chamber through the valve 95.

In the sputter chamber 21a, a sputtering is carded out for forming an undercoat on a disk substrate of aluminum. The disk substrate with the undercoat thus formed is further treated in another sputter chamber 21b for forming a magnetic film on the undercoat. In the plasma CVD chamber 22, the substrate is subjected to CVD for forming a protective film such as a carbon film on the magnetic film. In the sputter chambers 21a, 21b and the plasma CVD chamber 22 each have two processing areas for performing film-forming on opposite sides of the substrate 15.

As can be seen from FIG. 5, rails 18 for constituting conveyor means are provided before the charging chamber 19 and after the discharging chamber 23. The mils extend along the line of the system. The rails 18 are also provided in the respective chambers for transportation of the materials to be processed.

A holder 16 used in the magnetic disk manufacturing system of FIG. 5 has a plurality of through-holes 17 for accommodating the disks therein. The through-holes allow double-face processing on the substrate 15 when they are subjected to the plasma processing as will be described in detail referring to FIG. 6. Alternatively, the holes are not necessarily through-holes if only a single surface of the substrate is required to be subjected to the processing.

The present invention is applied to the plasma CVD chamber 22 as described above. FIG. 6 illustrates a vertical section of the CVD chamber 22.

The plasma processing apparatus shown in FIG. 6 has electrodes similar in configuration to those of FIG. 4C. More specifically, a pair of electrodes similar to those of FIG. 4C are disposed oppositely to each other, defining an interior space of a vacuum chamber 11 therebetween. Each electrode constitute a plasma processing apparatus, so that two apparatuses are provided in one vacuum chamber.

The vacuum chamber 1 is formed in a box-shape by a wall member 101. The chamber 1 has openings at a top and a bottom thereof, an lid members 102 are fitted to the openings, respectively, for air-tight sealing. The chamber 1 further has openings 103 in which the electrodes 5 are mounted together with supports 50c, respectively.

Each of the electrodes 5 includes a front portion 5a confronting a substrate fed in position for processing and a side portion 5b. The front portion 5a and the side portion 5b are electrically connected to each other by a connector means 5c such as a copper plate. A voltage for generating plasma is applied to each of the electrodes 5 from a voltage supplying means including a power source 7 and a matching network 7b. One voltage supplying means will suffice if the electrodes are commonly applied with the voltages from the same source.

The front portions 5a of the respective electrodes 5 are disposed so as to face the substrate holder 16 through a space for plasma generating area 13 therebetween. The front portions 5a of the electrodes 5 are made, for example, of a copper plate and connected to support members 104 through metal plates 5e, respectively. The support members 104 are fixed to the wall member 101 of the vacuum chamber 1 through insulators 25. The front portions 5a of the electrodes 5 receives a high-frequency power from the voltage supplying means such as the power source 7 through the support members 7, respectively.

A phase controller 7a is connected to each of the power source 7 for controlling the phase relationship between the high-frequency voltages applied from the respective voltage apply devices 7. Through the controller 7a, the phases of the high-frequency voltages can be matched or can be controlled to have a given phase difference therebetween.

Through-holes 105 and 106 are formed centrally in the front portion 5a and the support member 104, respectively. A connecting portion 91 is mounted externally to the support member 104 through an insulator 25 and a flange 92 for evacuation of the vacuum chamber 1 through the openings 105 and 106. The evacuation may be effected for the respective electrodes independently of each other.

The connecting portion 91 shown in FIG. 6 is connected to the evacuation system including the vacuum pump 96 through the valve 95 as shown in FIG. 5.

Since the evacuation can be effected for each processing area 13 associated with the respective electrode 5 independently of each other, possible contamination of plasma atmospheres of the adjacent processing areas 13. This independent evacuation system is especially desirable for applying different plasma processings to the opposite surfaces of the substrate 2.

Filter members 93 and 94 are fitted to the connecting portion 91. Each of the filters 93 and 94 has a number of apertures of not larger than 2 mm in diameter or width. The filters may be made, for example, of punching metal or metal mesh. The filters 93 and 94 are spaced by a distance not larger than 2 mm. Effluent or escape of the plasma due to the evacuation can be prevented by the filters 93 and 94.

The front portions 5a each has a plurality of gas introducing means 8 for introducing a gas into the vacuum chamber 1. The gas introducing means 8 is connected to a gas supply means 8a through a gas flow control means 8b, which constitute a gas supply system. The gas supply through the gas introducing means 8 may be carried out for the respective electrodes independently of each other.

The front portion 5a of the electrode 5 may further have means for measuring a gas pressure inside the vacuum chamber 1. The measuring means includes a 152 for communication between the inside and the outside of the chamber 1 and a gas pressure sensor 151 for measuring a gas pressure through the pipe 152.

Where the gas introduction is carried out for the respective electrodes independently of each other, the gas pressures of the plasmas generated by the respective electrodes can be controlled independently.

The side portion 5b of the electrode 5 functions as means for surrounding a space where plasma is generated. The side portion 5b is formed along the periphery of the front portion 5a to enclose the plasma produced in front of the front portion 5a. More particularly, the side portion 5b cooperates with the front portion 5a to define a processing area 13 of a rectangular parallelepiped. The side portion 5b may be an integral member or may alternatively be formed of a plurality of members.

The side portion 5b is connected on the back thereof to a grounded cover 26 through an insulator 26b and supported by the grounded cover 26. The side portion 5b has a tip portion 5b which extends substantially in parallel with the substrate holder 16. The tip portion 5b functions to prevent plasma leakage more positively.

The grounded cover 26 also has a tip portion 26a which extends in parallel with the tip portion 5d of the electrode 5. Thus, the grounded cover 26 is disposed externally along the side portion 5b of the electrode 5 to constitute an apparent double-conductor structure. The tip portion 26a of the grounded cover 26 extends in parallel with the tip portion 5 and disposed with a space 24 with reference to the confronting tip portion of another grounded cover 26. The substrate holder 16 is fed and discharged through the space 24.

The grounded cover 26 is connected to the vacuum chamber 1 through a part of a drive as will be described in detail later and kept at a ground potential. With this arrangement, the side portion 5b of the electrode 5 is covered by the grounded cover 26 of the ground potential. Therefore, even if the substrate holder 16 is displaced or deflected in a direction of the thickness of the substrate holder 16 (leftward or rightward as viewed in FIG. 6) to touch the grounded cover 26, there is caused no trouble because the both are of the ground potential.

A drive mechanism 27 is connected to a base portion of the grounded cover 26 for move the grounded cover 26 together with the side portion 5b of the electrode 5 to advance or retreat with reference to the substrate holder 16. The drive mechanism 27 comprises, for example, a pneumatic cylinder 27a, plunger 27b driven by the cylinder to eject or retreat, a rod 27d connected to the plunger 27b for conveying the displacement of the plunger, a connecting member 27e for connecting a tip end to the grounded cover 26, and bellows 27c which allows the displacement of the rod 27d.

The cylinder 27a is connected to a compressed air supply means through a solenoid valve (not shown) to actuate the plunger 27b by compressed air. Upon actuation of the plunger 27b, the side portion 5b of the electrode 5 advances or retreats with reference to the substrate holder 16 to vary the spacing 24. The side portions 5b of the electrodes 5 are preferably driven in synchronism with each other. For this reason, the cylinders 27a are driven in response to a common control signal to operate the solenoid valves synchronously. The synchronous control of the solenoids may be attained by another control means.

A conveyor rail 18 is provided at a lower portion of the chamber 1 for transporting the substrate holder 16. The conveyor rail 18 includes conveyor rollers 181 and a drive 182 for driving the conveyor rollers 181. The substrate holder 16 and the conveyor rail 18 constitute a substrate support means. The substrate holder 16 is grounded through the conveyor rails 18 and kept at the ground potential to function as a cold electrode with reference to the hot electrode 5. The substrate 2 held by the substrate holder 16 is at the ground potential.

In the plasma CVD chamber 22, a film is formed on the substrate 2. For example, when gas or vapor of hydrocarbon containing carbon and hydrogen or a derivative thereof is used, a carbon film suitable as a protective coating for a magnetic disk is formed. The plasma CVD chamber 22 may be used for other processings than the film forming. For example, when an inert gas or a reactive gas is used for conducting a plasma etching for a material to be processed. Or, an electron, ion or an active radical, or ultraviolet ray or heat generated by plasma may be utilized to reform the material to be processed.

In this embodiment, the preliminary treatment chamber 20 may have a structure only for heating, or may have a structure similar to that of the plasma CVD chamber, in which plasma of an inert gas such as argon is generated for effecting slight etching on the surface of the substrate. Actually, when the preliminary treatment chamber 20 similar in construction to the plasma CVD chamber is used to effect a preliminary treatment, by introducing argon gas into the chamber, keeping the gas pressure at 10 m Torr and generating plasma by 1 kW power to effect etching for three minutes, outgassing from the holder and the substrate is decreased and more clean atmosphere is attained as compared with the ease where the substrate is treated only by heating at 150° C.

EXAMPLE

A process for producing magnetic disks by operating the system described above will be hereinafter set forth referring to FIG. 5 and FIG. 6, as an example.

Prior to charging substrates 15 to be processed, the sputter chambers 21a and 21b are prepared as follows: a pair of Cr targets for a undercoat and a pair of CoNi alloy targets for a magnetic film are set to the cathodes for performing sputtering in sputter chambers 21a and 21b, respectively. After evacuating the sputter chamber 21, argon gas is introduced thereinto. Maintaining the gas pressure at 10 m Torr, direct-current plasma is generated, dummy sputtering is carried out for 1 to 2 hours and the production of plasma is thereafter stopped.

Twenty holders 16, each of which carries five magnetic disk substrates having a diameter of 5.25 in. thereon, are set in the charging chamber 19, the air in the charging chamber 19 is then evacuated.

One of the holders 16 is then transported in a direction towards the discharging chamber 23 and placed in the preliminary treatment chamber 20. The substrates 15 on the holder 16 are heated to approximately 150° C.

The succeeding holder 16 is transported from the charging chamber 19 into the preliminary treatment chamber 20 at the same time the holder 16 in the preliminary treatment chamber 20 is carded out to the sputter chamber 21. Thus, the holders 16 are fed one after another from the charging chamber 19 in synchronism with the processing in the respective chambers.

Sputtering is conducted on the disk substrates 15 to form a Cr film of approximately 30 nm thick thereon and to form a CoNi alloy film of 50 nm thick thereafter. The substrates 15 are then conveyed to the plasma CVD chamber 22.

For conveyance, the chamber is preliminarily evacuated and the side portion 5b of the electrode is moved away from the substrates to prepare the space 24 sufficient to pass the holder 16 therethrough. When the holder 16 reaches the processing section 13 and is stopped, the side portions 5b of the respective electrodes 5 are moved in a direction towards the holder 16 to reduce the width of the clearance 24 so that a distance between the electrodes 5 and the holder 16 is decreased.

$CH_4$ gas is thereafter introduced and the flow rate and the exhaust rate thereof are adjusted so as to keep the gas pressure constant at 50 m Torr. A high voltage of 13.56 MHz is applied to produce plasma. The effective power is 2 kW.

The plasma generation is maintained for one minute. Thereafter, the voltage application is stopped, the side portions 5b are retracted from the substrates 2, and the gas introduction is stopped and exhausted. After that, the holder 16 is carded out to the discharging chamber 23 simultaneously the succeeding substrates are conveyed into the plasma CVD chamber 22.

These procedures are repeated until the protection film are formed on all the disk substrates 15 mounted on the twenty holders 16.

When the interior of the processing section 13 of the plasma CVD chamber 22 is inspected, no attachment of the film is found but on the electrodes, and no dust produced is observed.

The present invention is applicable to various plasma processing apparatuses, so long as the apparatuses are of an internal electrode type. The most remarkable effect is obtained, when this invention is applied to a plasma CVD method or an ion etching method, in which ion having a high energy is generated by self bias of high-frequency plasma to form a film or to perform etching. The present invention is further applicable to a hard carbon film forming using hydrocarbon gas, a reactive ion etching using halogen gases, a substrate surface modification utilizing charged particles, etc.

While there has been described what are considered to be the preferred embodiments of the invention, other modifications may occur to those skilled in the art, and it is described to cover in the appended claims all such modifications as fall within the true spirit and scope of the invention.

What is claimed is:

1. A plasma processing apparatus comprising:
   a vacuum container;
   an evacuation means for keeping the interior of the vacuum container at a pressure not higher than atmospheric pressure;
   a substrate support means for supporting a substrate to be subjected to plasma processing;
   an electrode for generating plasma in cooperation with the substrate support means;
   a voltage supplying means for applying a voltage to the electrode;
   a gas introducing means for introducing a gaseous material into a space where the plasma is produced;
   a surrounding member for enclosing the space above the substrate means, the surrounding member including a conductor member and a grounded cover electrically insulated from the conductor member; and
   a drive means for relatively moving the surrounding member including the conductor member and the grounded cover to locate an extremity of the surrounding member spaced from at least one of the substrate support means and the substrate supported thereon by a distance which is short enough to suppress plasma leakage during the plasma processing and to position the extremity of the surrounding member away from said at least one of the substrate support means and the substrate thereon for charging and discharging of the substrate.

2. A plasma processing apparatus according to claim 1, wherein two sets of said evacuation means electrode, voltage supply means, gas introduction means, surrounding member and drive means are provided; each set being disposed on opposite sides of the substrate support means for carrying out the plasma processing on opposite surfaces of the substrate; said substrate support means including a substrate holding means for holding the substrate so that the opposite surfaces of the substrate are subjected to the plasma processing.

3. A plasma processing apparatus according to claim 1, wherein the conductor member of said surrounding member is formed of an extension of the electrode which extends along a plane which surrounds plasma generated; and said drive means is adapted to move the entire electrode towards or from the substrate support means.

4. A plasma processing apparatus according to claim 3, wherein said substrate support means includes the substrate support means and a transportation means for transporting the substrate into or from a plasma processing area in the vacuum container through the substrate support means; said transportation means being adapted to stop the transportation when the surrounding member is located near the substrate and conduct the transportation when the surrounding member is located away from the substrate.

5. A plasma processing apparatus according to claim 3, wherein said electrode and said surrounding member have, during the plasma processing, an area in contact with the plasma produced which is larger than that of the substrate and the substrate support means which are at a ground potential.

6. A plasma processing apparatus according to claim 2, wherein the conductor member of said surrounding member comprising is a member formed separately from the electrode for generating plasma and electrically connected to the electrode to have the same potential as the electrode; and said drive means is adapted to move the surrounding member towards or from the substrate support means.

7. A plasma processing apparatus according to claim 6, further comprising a synchronous control means which generates a control signal for driving the driving means in synchronism with each other.

8. A plasma processing apparatus according to claim 7, wherein said substrate support means includes a transportation means for transporting the substrate into or from a plasma processing area in the vacuum container through the substrate holding means; and said synchronous control means generates another control signal for said transportation means; said transportation means being adapted to stop the transportation when the surrounding member is located near the substrate and carry out the transportation when the surrounding member is located away from the substrate in response to the control signal from the synchronous control means.

9. A plasma processing apparatus according to claim 6, wherein said electrode and said surrounding member have, during the plasma processing, an area in contact with the plasma produced which is larger than that of the substrate and the substrate support means which are at a ground potential.

10. A plasma processing apparatus according to claim 2, wherein said electrode has a gas introduction means formed therein for supplying a gaseous material usage for plasma generation.

11. A plasma processing apparatus according to claim 2, wherein said electrode has an exhaust outlet communicating with the evacuation means formed therein for evacuating a gas in a space surrounded by the electrode and the surrounding means.

12. A plasma processing apparatus according to claim 11, further comprising a filter provided in a path from the exhaust outlet to the evacuation means for preventing escape of plasma.

13. An in-line processing apparatus comprising a plurality of vacuum containers connected in series; at least one of said vacuum containers being the plasma processing apparatus according to claim 2.

14. A plasma processing apparatus according to claim 2, wherein each of the two voltage supply means outputs a high-frequency power, and which further comprises a phase controller for controlling phases of the high-frequency power output from the voltage supply means.

15. A magnetic disk producing apparatus comprising:
    a plurality of vacuum containers connected in series;
    said vacuum containers comprising a charging chamber for introducing a material to be processed; a preliminary-treatment chamber for subjecting the material to a preliminary treatment; a first sputter chamber for applying an undercoat on the material; a second sputter chamber for applying a magnetic film to the material on the undercoat; and a plasma CVD chamber for forming a protective film on the magnetic film of the material; and a transportation means for transporting the material sequentially into and from the chambers;

said plasma CVD chamber being provided with a plasma CVD apparatus according to claim 2.

16. A plasma processing apparatus according to claim 1, wherein the conductor member of said surrounding member is a member formed separately from the electrode for generating plasma and electrically connected to the electrode to have the same potential as the electrode; and said drive means is adapted to move the surrounding member towards or from the substrate support means.

17. A plasma processing apparatus according to claim 16, wherein said electrode and said surrounding member have, during the plasma processing, an area in contact with the plasma produced which is larger than that of the substrate and the substrate support means which are at a ground potential.

18. A plasma processing apparatus according to claim 1, wherein said electrode has a gas introduction means formed therein for supplying a gaseous material usable for plasma generation.

19. An in-line processing apparatus comprising a plurality of vacuum containers connected in series; at least one of said vacuum containers being the plasma processing apparatus according to claim 1.

20. A magnetic disk producing apparatus including:

a plurality of vacuum containers connected in series;

said vacuum containers comprising a charging chamber for introducing a material to be processed; a preliminary-treatment chamber for subjecting the material to a preliminary treatment; a first sputter chamber for applying an undercoat on the material; a second sputter chamber for applying a magnetic film to the material on the undercoat; and a plasma CVD chamber for forming a protective film on the magnetic film of the material, the plasma CVD chamber being provided with a plasma CVD apparatus according to claim 1; and a transportation means for transporting the material sequentially into and from the chambers.

21. A plasma processing apparatus comprising:

vacuum container;

evacuation means for maintaining the interior of the vacuum container at a pressure not higher than atmospheric pressure;

substrate support means for supporting a substrate to be subjected to plasma processing;

a high-frequency voltage electrode for generating plasma in cooperation with the substrate support means;

voltage supplying means for supplying a high-frequency voltage to the high-frequency voltage electrode;

gas introducing means for introducing a gaseous material into a space where the plasma is produced;

a movable surrounding member for enclosing the space above the substrate support means so that during plasma processing the space above the substrate support means on which the substrate is placed is surrounded by the movable surrounding member in cooperation with the high-frequency voltage electrode and the substrate support means for trapping plasma therein, the movable surrounding member including a first conductive portion connected with the high-frequency voltage and a second grounded conductive portion which is at least electrically insulated from the first conductive portion; and drive means for moving at least the movable surrounding member so as to position an extremity of the movable surrounding member in a direction toward at least one of the substrate support means and the substrate supported thereon at a distance from at least one of the substrate support means and the substrate supported thereon sufficient to suppress plasma leakage during the plasma processing and for moving the movable surrounding member in a direction away from at least one of the substrate support means and the substrate thereon so as to position the extremity of the surrounding member away from the substrate support means to enable the substrate to be at least one of charged and discharged from the space above the substrate support means at least one of prior to and after the plasma processing.

22. A plasma processing apparatus comprising:

a vacuum container;

evacuation means for maintaining the interior of the vacuum container at a pressure not higher than atmospheric pressure;

substrate support means for supporting a substrate to be subjected to plasma processing;

a movable surrounding electrode for generating plasma in cooperation with the substrate support means;

voltage applying means for applying a high frequency voltage to the surrounding electrode;

gas introducing means for introducing a gaseous material into a space where the plasma is produced;

a movable surrounding member which is maintained at ground potential for suppressing generation of a plasma outside of a space between the surrounding electrode and the substrate support means, at least one of the surrounding electrode and the surrounding member having an area in contact with the plasma produced which is larger than that of the substrate and the substrate support means; and drive means for moving both the surrounding electrode and the surrounding member with respect to the substrate support means and the substrate supported therein so as to position an extremity of the surrounding member at a distance from at least one of the substrate support means and the substrate supported thereon sufficient to suppress plasma leakage and to generate a positively biased plasma potential during the plasma processing, and for moving at least the surrounding member so as to position the extremity of the surrounding member away from the at least one of the substrate support means and the substrate thereon for charging and discharging of the substrate.

23. A plasma processing apparatus according to claim 22, wherein the surrounding electrode has an area in contact with the plasma produced which is larger than that of the substrate and the substrate support means.

* * * * *